United States Patent
Shibuya et al.

(10) Patent No.: US 11,062,980 B2
(45) Date of Patent: Jul. 13, 2021

(54) INTEGRATED CIRCUIT PACKAGES WITH WETTABLE FLANKS AND METHODS OF MANUFACTURING THE SAME

(71) Applicant: Texas Instruments Incorporated, Dallas, TX (US)

(72) Inventors: Makoto Shibuya, Beppu (JP); Daiki Komatsu, Beppu (JP)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/858,962

(22) Filed: Dec. 29, 2017

(65) Prior Publication Data

US 2019/0206768 A1    Jul. 4, 2019

(51) Int. Cl.
*H01L 23/495* (2006.01)
*H01L 23/31* (2006.01)
(Continued)

(52) U.S. Cl.
CPC .... *H01L 23/49541* (2013.01); *H01L 21/4803* (2013.01); *H01L 21/4842* (2013.01); *H01L 21/565* (2013.01); *H01L 21/568* (2013.01); *H01L 23/3121* (2013.01); *H01L 23/49503* (2013.01); *H01L 23/49548* (2013.01); *H01L 23/49582* (2013.01); *H01L 23/49586* (2013.01); *H01L 23/49861* (2013.01); *H01L 24/32* (2013.01); *H01L 24/48* (2013.01); *H01L 24/73* (2013.01); *H01L 24/83* (2013.01); *H01L 24/85* (2013.01); *H01L 24/92* (2013.01); *H01L 2224/32245* (2013.01); *H01L 2224/48091* (2013.01); *H01L 2224/48106* (2013.01); *H01L 2224/48247* (2013.01); *H01L 2224/73265* (2013.01); *H01L 2224/92247* (2013.01); *H01L 2924/00014* (2013.01); *H01L 2924/14* (2013.01); *H01L 2924/181* (2013.01)

(58) Field of Classification Search
CPC ......... H01L 23/49586; H01L 23/49503; H01L 24/48; H01L 24/85; H01L 2224/92247; H01L 2224/73265; H01L 23/3121; H01L 21/565; H01L 21/4842; H01L 2224/48247; H01L 23/49541; H01L 24/83; H01L 24/92; H01L 24/73; H01L 2924/181; H01L 2224/32245
See application file for complete search history.

(56) References Cited

U.S. PATENT DOCUMENTS

| | | | |
|---|---|---|---|
| 6,777,788 B1 * | 8/2004 | Wan ........................ | H05K 3/341 174/528 |
| 9,935,039 B2 * | 4/2018 | Khor ................. | H01L 23/49513 |

(Continued)

*Primary Examiner* — Thanh Y. Tran
(74) *Attorney, Agent, or Firm* — Dawn Jos; Charles A. Brill; Frank D. Cimino

(57) ABSTRACT

Leadframes, integrated circuit packaging with wettable flanks, and methods of manufacturing the same are disclosed. An example packaged device having a leadframe includes a die pad and a lead spaced apart from the die pad. The lead has a proximal end adjacent the die pad and a distal end extending away from the die pad. The lead has a thickness at the distal end that is less than a full thickness of the leadframe between a first outer surface on a die attach side of the leadframe and a second outer surface on a mounting side of the leadframe.

13 Claims, 13 Drawing Sheets

(51) Int. Cl.
  *H01L 21/56*    (2006.01)
  *H01L 21/48*    (2006.01)
  *H01L 23/00*    (2006.01)
  *H01L 23/498*   (2006.01)

(56) References Cited

U.S. PATENT DOCUMENTS

| | | | |
|---|---|---|---|
| 10,079,198 B1* | 9/2018 | Cadag | H01L 23/3121 |
| 10,340,207 B2* | 7/2019 | Imori | H01L 24/49 |
| 2005/0287710 A1* | 12/2005 | Huang | H01L 21/4828 |
| | | | 438/123 |
| 2007/0001278 A1* | 1/2007 | Jeon | H01L 21/561 |
| | | | 257/676 |
| 2011/0248393 A1* | 10/2011 | Lu | H01L 24/97 |
| | | | 257/676 |
| 2012/0181675 A1* | 7/2012 | Jeon | H01L 23/3121 |
| | | | 257/666 |
| 2016/0254214 A1* | 9/2016 | Makino | H01L 23/49582 |
| | | | 257/676 |
| 2016/0260656 A1* | 9/2016 | Hwang | H01L 23/49503 |
| 2018/0033647 A1* | 2/2018 | Bin Mohd Arshad | |
| | | | H01L 21/565 |

* cited by examiner

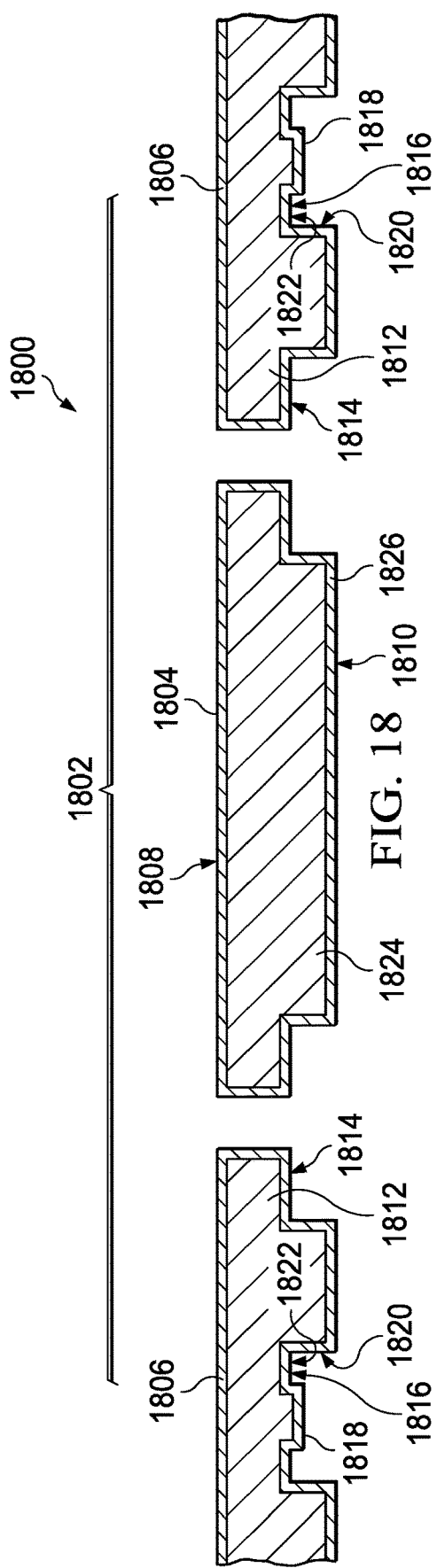
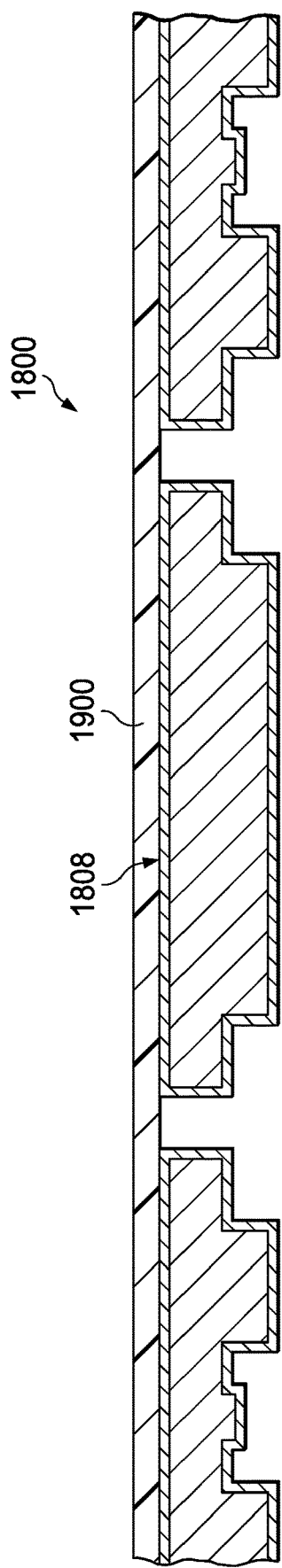
FIG. 18
FIG. 19

INTEGRATED CIRCUIT PACKAGES WITH WETTABLE FLANKS AND METHODS OF MANUFACTURING THE SAME

FIELD OF THE DISCLOSURE

This disclosure relates generally to integrated circuit packaging, and, more particularly, to integrated circuit packages with wettable flanks and methods of manufacturing the same.

BACKGROUND

Integrated circuit (IC) packaging involves the encapsulation or sealing of semiconductor devices on a leadframe within a housing. The leadframe in an IC package includes electrical contacts to connect the devices with electrical components external to the package (e.g., a printed circuit board (PCB)). In some IC packaging, the electrical contacts are leads that extend out from the package housing. In other IC packaging, there are no leads that extend out from the housing. Rather, the package includes electrical lands substantially in line with the surface of the housing for surface mounting to a PCB. Example IC packages that do not have protruding leads include quad-flat no-leads (QFN) packages and dual-flat no-leads (DFN) packages.

SUMMARY

An example leadframe for an integrated circuit package includes a die pad, and a lead spaced apart from the die pad. The lead has a proximal end adjacent the die pad and a distal end extending away from the die pad. The lead has a first thickness at the distal end that is less than a second thickness at the proximal end.

An example integrated circuit package includes a die, and a leadframe plated with a solderable metal. The leadframe includes a die pad to mount the die, and a lead spaced apart from the die pad. The lead has a stepped profile defined by an inner surface of the lead, an outer surface of the lead, and a lateral facing surface extending between the inner and outer surfaces. The inner, outer, and lateral facing surfaces include the solderable metal and are exposed to an external environment of the integrated circuit package.

An example method includes depositing, with an additive manufacturing device, a first layer of a molding compound into gaps between a die pad of a leadframe and a lead of the leadframe. The first layer corresponds to a first pattern. The example method further includes depositing, with the additive manufacturing device, a second layer of the molding compound into the gaps. The second layer corresponds to a second pattern. The first and second patterns correspond to different portions of the gaps.

BRIEF DESCRIPTION OF THE DRAWINGS

FIGS. 18-23 illustrate example stages in a process of manufacturing IC packages based on the example leadframe strips of FIGS. 11-17.

Figure 1:
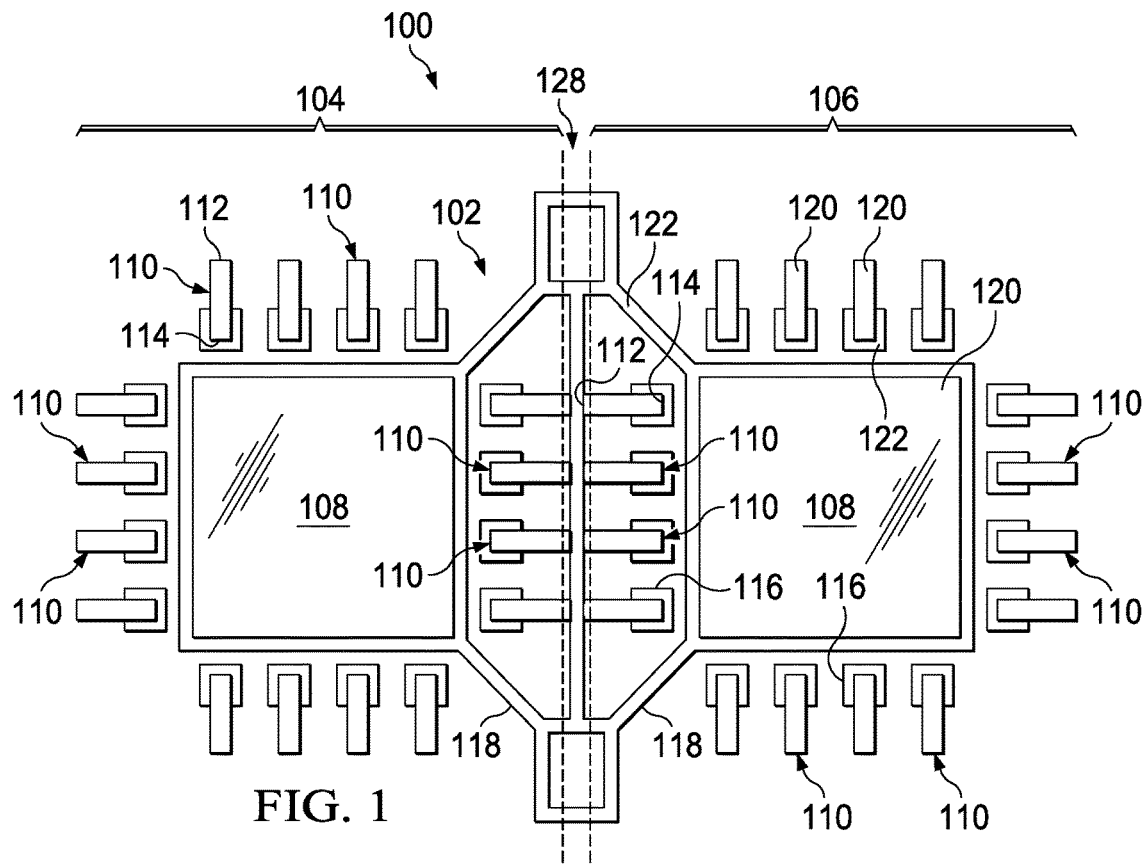
FIG. 1 is a plan view of the mounting side of an example leadframe strip.

The figures are not to scale. Instead, to clarify layers and/or regions, the thickness of the layers and/or regions may be enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Many IC packages include a leadframe onto which one or more dies containing semiconductor devices are mounted and electrically attached. Subsequently, the leadframe and die(s) are encapsulated within a molding compound forming a housing around the leadframe and die(s). Typically, leadframes include a plurality of electrical contacts or leads that are exposed to an external environment surrounding the molded housing to enable the device(s) within the housing to be electrical coupled with one or more other electrical components external to the housing.

As the contents of IC packages have become more complicated (e.g., system in packages (SIPs)), the design of the leadframe supporting and interconnecting the semiconductor dies has also become more complicated. In some examples, to facilitate packaging processes, complicated leadframes are often pre-molded. As used herein, a "pre-molded" leadframe refers to a leadframe that is partially encased in a molding compound before any dies are mounted thereon and, thus, before the final molding process to encapsulate the entire assembly with an encapsulant is performed. For purposes of clarity, the final molding process is referred to herein as an encapsulation process to distinguish it from the pre-molding process that applies a molding compound to the leadframe before die attachment. Further, the molding compound applied during the encapsulation process is referred to herein as an encapsulant to distinguish it from the molding compound applied during the pre-molding process. However, this naming convention is used only for purposes of distinguishing pre-molding from final molding. The encapsulant (for the encapsulation process) may be the same material as the molding compound (for the pre-molding process). Moreover, "encapsulation" may not be complete. Rather, one or more components (e.g., plated leads or portions thereof) may be exposed after encapsulation.

Pre-molded leadframes help support and maintain the relative position of separate portions of the leadframe (e.g., individual leads and separate die pads) while still leaving such portions exposed for when the dies are subsequently attached and electrically connected. In some examples, the pre-molding processes may involve applying a molding compound to multiple interconnected leadframes associated with separate IC packages that are subsequently cut (e.g., via a singulation process). Multiple interconnected leadframes, intended for separate IC packages, are collectively referred to herein as a "leadframe strip."

While pre-molded leadframes enable more complex IC packages, there are significant costs involved with the current methods of manufacturing such components. Among other things, there is the need to design and build and/or otherwise acquire the molds for each new leadframe design. Typically, the molding of pre-molded leadframes involves transfer molding processes, which may result in mold flashing. Accordingly, such molding processes need to be designed for each leadframe design to reduce mold flashing and/or may include additional processes to remove such flashing.

Examples disclosed herein enable the creation of pre-molded leadframes without the need for specifically designed molds and without the problem of dealing with the resulting mold flashing. In particular, examples disclosed herein apply a molding compound to a leadframe via an additive manufacturing device. In some examples, the additive manufacturing device is a printer (e.g., an inkjet printer) equipped to dispense the molding compound via the nozzles of a printhead. Some such printers have over 500 nozzles per head for a relatively high throughput. Additive manufacturing devices can apply (e.g., print) thin layers of a molding compound to selective areas without the need for a mask or a specially designed mold. The thickness of the molding compound at any particular point may be controlled by the number of layers of the compound the additive manufacturing device dispenses at the particular point. As a result, the upfront design costs for such pre-molded leadframes are relatively small because there is no need to design or acquire new molding tools for each new leadframe. Furthermore, there is no concern of mold flashing because transfer molding processes are not employed in examples disclosed herein. Further still, in some examples, the molding compound is applied to specific locations rather than across the entire leadframe to reduce the total amount of molding compound used, thereby further reducing costs.

The use of additive manufacturing processes to form pre-molded leadframes results in improved leadframe(s) with wettable flanks for IC packages that do not have leads protruding from the housing (e.g., QFN or DFN packages). Wettable flanks refer to non-protruding leads or contact lands of a leadframe which are manufactured in a manner that promotes wetting of solder to the leads when mounted to a PCB. Wettable flanks enable the formation of a solder fillet that may be visually inspected (e.g., via automated optical inspection (AOI)) to verify an acceptable solder joint was formed between the lead and the PCB. Acceptable wetting may be achieved by coating or plating the underlying material of the leadframe (typically copper) with a solderable metal (different than copper) that offers increased wettability for solder (i.e., exhibits increased solderability). Example metals that exploit high degrees of solderability include nickel, palladium, tin, and gold.

In some examples, the leadframe is plated with the solderable metal when the leadframe is manufactured before the pre-molding process or subsequent attachment of dies or other packaging processes. In such examples, the entire exterior surface of the leadframe is initially plated with the solderable metal. However, during the singulation process when individual IC packages are cut out, the singulation saw will cut through the leadframe to expose the internal copper material. At such locations, the exposed copper surface may not provide sufficient wetting for solder to form solder fillets needed for inspection.

Examples disclosed herein enable leadframe(s) in which exposed portions of non-protruding leads of an IC package retain the solderable metal on the outside of at least a part of the leads after the singulation process so that proper wetting may occur when the package is soldered to a PCB. In particular, in some examples, an additive manufacturing device applies a molding compound to a leadframe during a pre-molding process to form a trench or cavity around leads of the leadframe that are shaped with a stepped profile. The stepped profile of the leads enables a singulation saw to cut through one portion of the leads, thus, exposing the bare copper of the leadframe, while the remaining portion of the leads remain coated with a solderable metal. Further, the pre-molded trench or cavity surrounding the leads isolates the leads during the encapsulation process. In this manner, the exposed portions of the leads plated with the plating material remain exposed to the external environment after the completion of the IC package is assembled to provide wettable flanks for subsequent mounting to a PCB.

Figure 2:
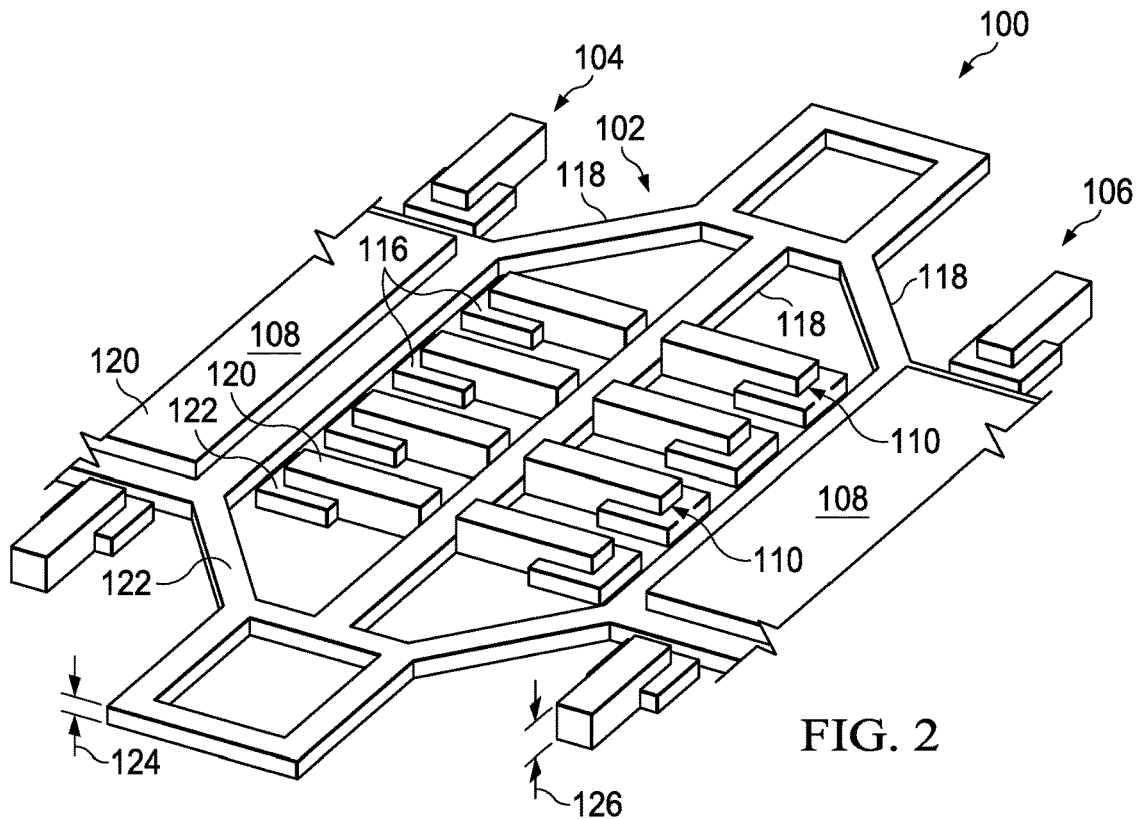
FIG. 2 is an angled detail view of a central region of the mounting side of the leadframe strip of FIG. 1.

FIG. 1 illustrates the mounting side of an example leadframe strip 100. FIG. 2 is an angled detail view of a central region 102 of the mounting side of the leadframe strip 100 of FIG. 1. As used herein, the "mounting side" of a leadframe refers to the side that faces a PCB when a corresponding IC package is mounted (e.g., soldered) to the PCB. The side opposite the mounting side of a leadframe is referred to herein as the "die attach side" and corresponds to the side of the leadframe onto which a die is attached.

In FIG. 1, the leadframe strip 100 includes first and second leadframes 104, 106, each having a corresponding die pad 108 surrounded by a series of leads 110 that are spaced apart from one another and the die pads 108. As shown in FIG. 1, the leads 110 are oriented to extend outward from the associated die pad 108 with a distal end 112 farther away from the die pad 108 than a proximal end 114. The leads 110 include wire bonding lands 116 adjacent the associated die pad 108 at the proximal end 114. The wire bonding lands 116 are an integral part of the leads 110 on the die attach side of the leadframes 104, 106 to enable the electrical connection of a die attached to the die attach side of the die pads 108.

Figure 3:
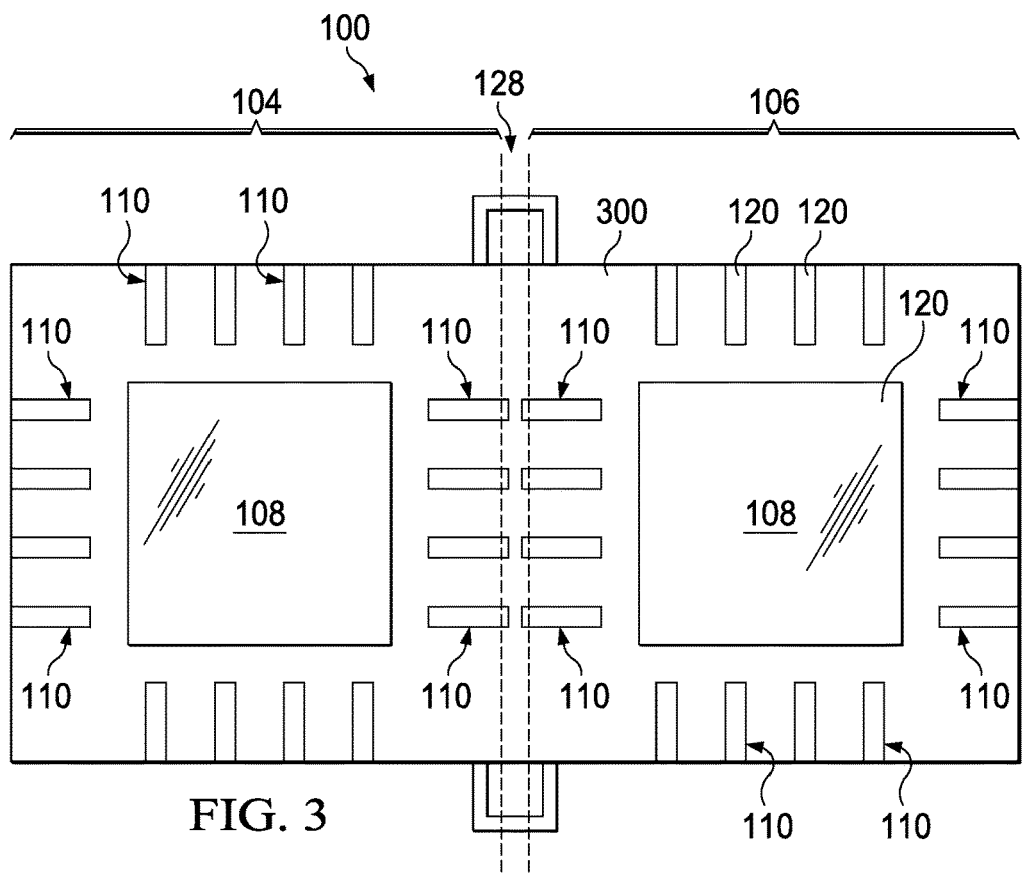
FIG. 3 is a plan view of the example leadframe strip corresponding to FIG. 1 after an encapsulation process.
Figure 4:
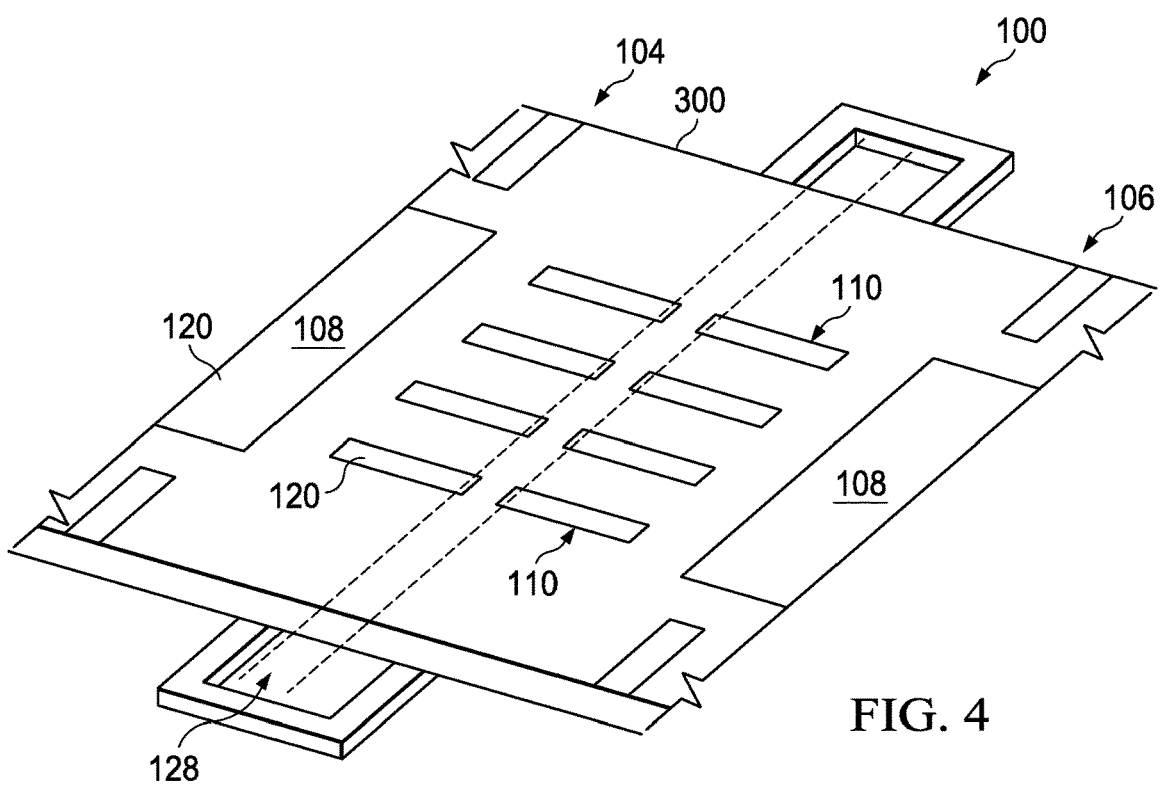
FIG. 4 is an angled detail view of the example leadframe strip corresponding to FIG. 2 after the encapsulation process.

As shown in FIG. 1, the two die pads 108 and the leads 110 in the central region 102 are connected by ribs 118 of the leadframe strip 100. Additional ribs interconnecting the other leads 110 to the rest of the leadframe strip 100 have been omitted for the sake of clarity. Other, dies are attached to each respective die pad 108 and electrically connected to the leadframes 104, 106 via wire bonds connected to the wire bonding lands 116 while the leadframes 104, 106 are still interconnected via the ribs 118. Furthermore, the dies (and the associated wire bonds) are encapsulated within an encapsulant while the leadframes 104, 106 are still interconnected as part of the leadframe strip 100 (e.g., during an encapsulation process). In some instances, the encapsulant is applied via a transfer molding process in which the compound flows into and fills the gaps between the die pads 108 and the leads 110 up to an outer surface 120 of the leadframe strip 100 on the mounting side. As shown in FIG. 1, the ribs 118 and the wire bonding lands 116 extend as far as an inner surface 122 that is substantially parallel (e.g., with 5 degrees) and recessed relative to the outer surface 120 of the mounting side. That is, the ribs 118 and the wire bonding lands 116 have a thickness 124 that is less than the full thickness 126 of the leadframe strip 100 and are spaced apart from the outer surface 120 of the mounting side. Therefore, the ribs 118 and the wire bonding lands 116 will be covered during the encapsulation process by an encapsulant 300 as illustrated in FIGS. 3 and 4, which correspond to the same views of the leadframe strip 100 as shown in FIGS. 1 and 2, respectively, except after the encapsulation process. As shown in FIGS. 3 and 4, the portions of the die pads 108 and the leads 110 corresponding to the outer surface 120 of the mounting side of the leadframe strip 100 remain exposed to the exterior environment.

Exposure of the outer surface 120 of the die pads 108 to the external environment as shown in FIG. 3 provides for heat dissipation. Exposure of the outer surface of the leads 110 to the external environment provides contact point(s) to electrically connect or mount a completed IC package to a PCB (e.g., by soldering). Before the IC package associated with either of the leadframes 104, 106 may be mounted to a PCB, the leadframes 104, 106 and associated components need to be separated through a singulation process. Singulation involves the cutting of the molded leadframe strip 100 into individual IC packages corresponding to each of the leadframes 104, 106. A path 128 of the singulation saw is represented by the dashed lines shown in FIGS. 1, 3, and 4. The path 128 generally corresponds to the rib 118 connecting the distal ends of the leads 110 in the central region 102 between the leadframes 104, 106. As a result of the singulation process, not only is the outer surface 120 of the leads 110 on the mounting side of the leadframes 104, 106 exposed to the exterior environment as described above, but the entire cross-sections of the leads 110 are also exposed along the side or perimeter of the IC package where the singulation saw cut through the leadframes 104, 106.

Figure 5:
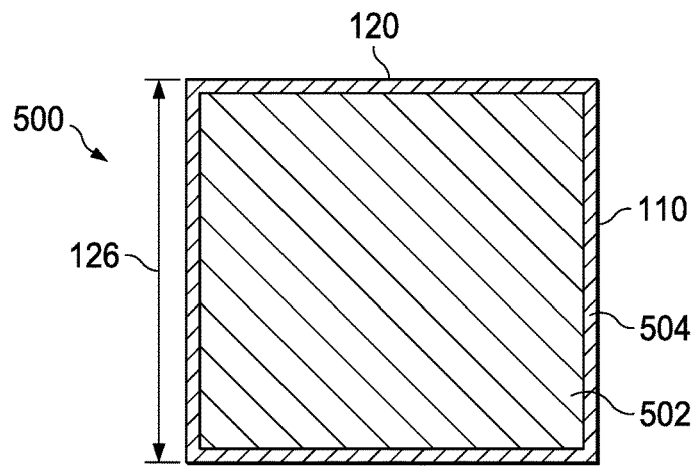
FIG. 5 is an exposed cross-section of one of the example leads on the example leadframe strip of FIGS. 1-4 after singulation.

FIG. 5 illustrates an exposed cross-section 500 of one of the example leads 110 of FIGS. 3 and 4 after singulation. The entire area of the cross-section 500 corresponds to a cut surface of the leads 110 because the leads 110 have a thickness corresponding to the full thickness 126 of the associated leadframe. In FIG. 5, the outer surface 120 corresponding to the mounting side of the associated leadframe is represented at the top of the drawing. In the illustrated example, the lead 110 is made of copper 502 with a solderable metal 504 coating its exterior surface. The solderable metal 504 is applied to the entire exterior surface of the leadframe strip 100 of FIG. 1. Thus, the underlying copper 502 of the lead 110 is not exposed until after the lead 110 is cut in the singulation process. As described above, copper does not provide adequate wettability to form inspectable solder fillets. Accordingly, example IC packages manufactured in accordance with the example leadframes 104, 106 of FIGS. 1-5 may not be suitable for certain applications that depend upon an inspection of solder joints after package mounting.

Figure 6:
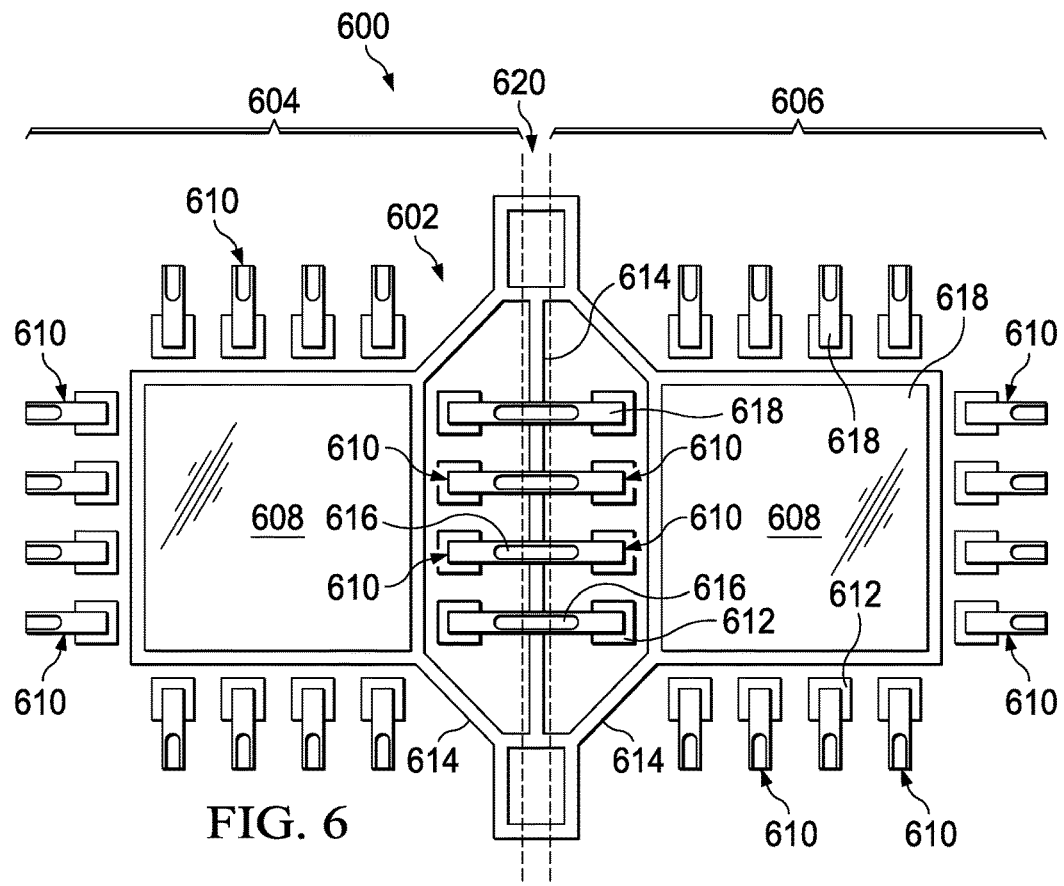
FIG. 6 is a plan view of the mounting side of another example leadframe strip.
Figure 7:
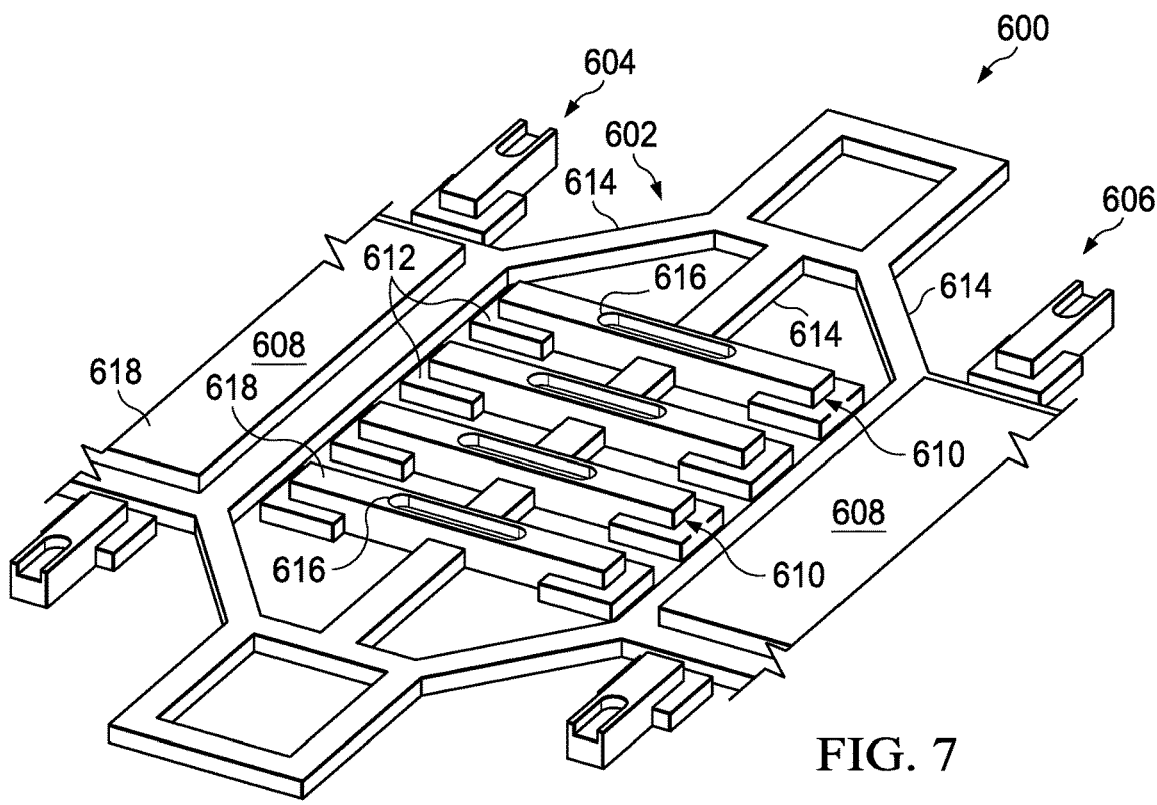
FIG. 7 is an angled detail view of a central region of the mounting side of the leadframe strip of FIG. 6.

One solution to the above problem is to manufacture leadframes with dimples that enable the creation of wettable flanks on IC packages. FIG. 6 illustrates the mounting side of another leadframe strip 600 manufactured using such dimples. FIG. 7 is an angled detail view of a central region 602 of the mounting side of the leadframe strip 600 of FIG. 6. The leadframe strip 600 includes first and second leadframes 604, 606, each having a corresponding die pad 608 surrounded by a series of leads 610 (with wire bonding lands 612) that are spaced apart from one another and the die pads 608 in a similar arrangement to the example leadframes 104, 106 of FIGS. 1 and 2 as described above. Ribs 614 (also known as tie bars) interconnect the separate die pads 608 and leads 610.

Figure 8:
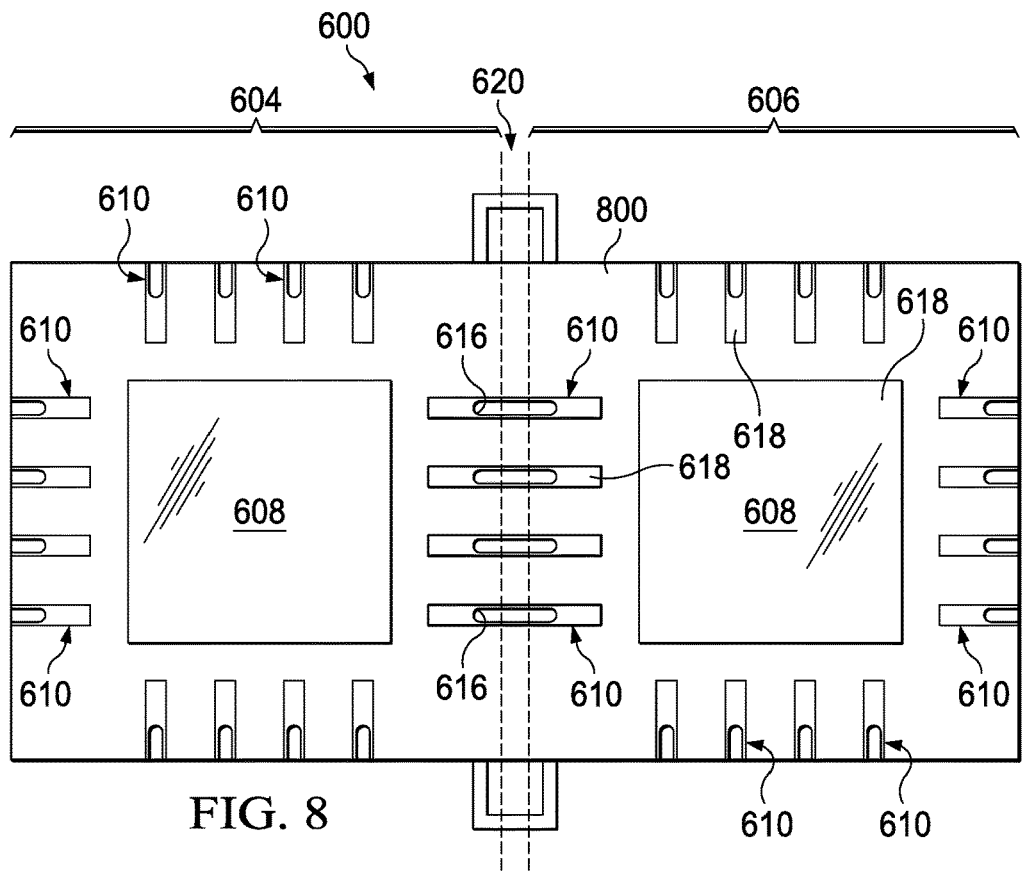
FIG. 8 is a plan view of the example leadframe strip corresponding to FIG. 6 after an encapsulation process.
Figure 9:
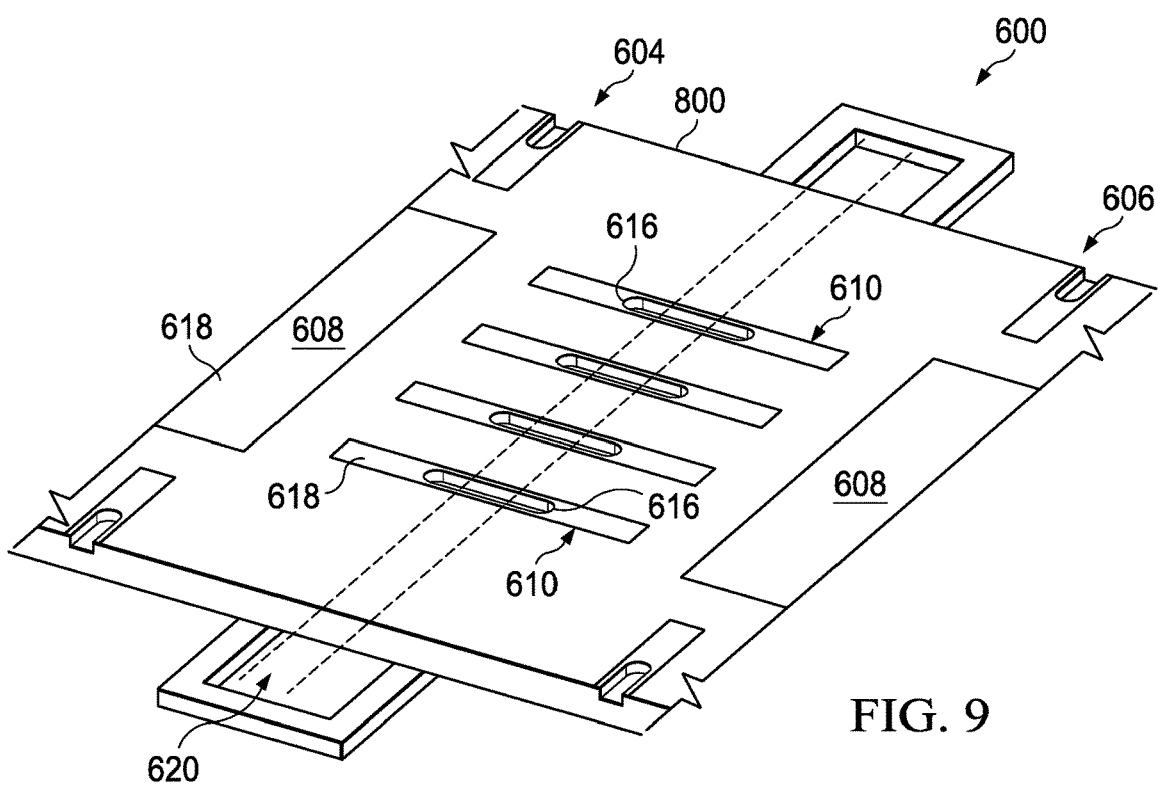
FIG. 9 is an angled detail view of the example leadframe strip corresponding to FIG. 7 after the encapsulation process.

The leadframes 604, 606 of FIGS. 6 and 7 differ from the leadframes 104, 106 of FIGS. 1 and 2 in the corresponding leads 110, 610. Unlike the leads 110 of FIGS. 1 and 2, the leads 610 shown in FIGS. 6 and 7 include recesses or dimples 616 within an outer surface 618 of the mounting side of the leadframe strip 600. As described above, when the leadframe strip 600 undergoes an encapsulation process (after dies have been attached and electrically wired to the respective leadframes 604, 606), an encapsulant 800 flows through the gaps between the die pads 608, the leads 610, and the ribs 614 to cover and encase all portions of the leadframes 604, 606 up to the outer surface 618 as shown in FIGS. 8 and 9. FIGS. 8 and 9 correspond to the views of the leadframe strip 600 as shown in FIGS. 6 and 7, respectively, except that FIGS. 8 and 9 show the leadframe strip 600 after the encapsulation process has been completed. Inasmuch as the dimples 616 are completely surrounded by the outer surface 618 of the mounting side of the leads 610, the encapsulant 800 is unable to get into the dimples 616 during the encapsulation process so that the dimples 616 remain exposed to the exterior environment.

Figure 10:
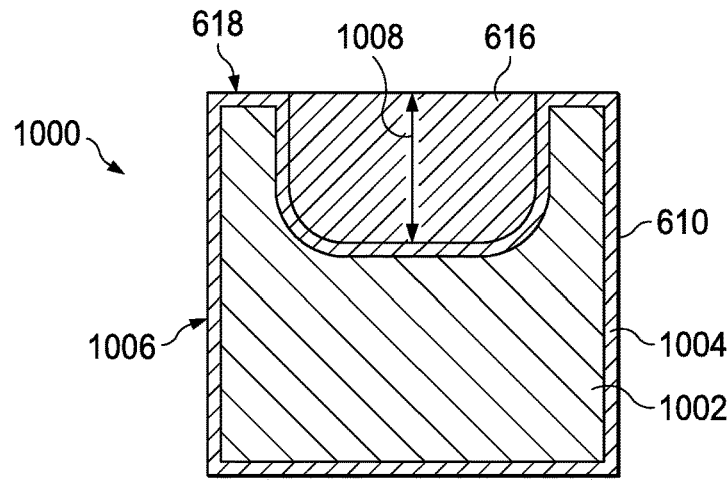
FIG. 10 is an exposed cross-section of one of the example leads on the example leadframe strip of FIGS. 6-9 after singulation.

After the encapsulation process, the leadframes 604, 606 (and the encapsulated dies mounted thereon) are separated by singulation along a singulation path 620 represented in FIGS. 6, 8 and 9 by the dashed lines. As discussed above, as a singulation saw travels along the path 620, the saw will cut through the leads 610 thereby exposing a cross-section 1000 of the distal ends of the leads 610 as represented in FIG. 10. The outer surface 618 corresponding to the mounting side of the associated leadframe is represented at the top of the drawing. The lead 610 is made of copper 1002 with a solderable metal 1004 coating its exterior surface. In contrast to the exposed cross-section 500 of the lead 110 shown in FIG. 5, the exposed cross-section 1000 of the lead 610 shown in FIG. 10 includes the dimple 616. Thus, the cross-section 1000 includes a cut surface 1006 corresponding to the copper 1002 that is less than the entire area of the cross-section 1000. In particular, as shown in FIG. 10, the surface of the dimple 616 remains plated with the solderable metal 1004 because it is spaced apart from the path 620 of singulation. The exposure of the solderable metal 1004 on the dimple 616 provides a wettable flank that facilitates the formation of solder fillets when the corresponding IC package is soldered to a PCB.

While the dimple 616 shown in FIG. 10 enables the formation of wettable flanks on IC packages, a depth 1008 of the dimple 616 is limited to no more than half the width of the lead 610 due to the shape of the dimple 616. Thus, a majority of the exposed cross-section 1000 of the lead 610 corresponds to exposed copper 1002. That is, the total area of the cut surface 1006 is greater than half the area of the entire cross-section 1000. The relatively large proportion of exposed copper reduces the wettability of the lead 610.

In contrast to the example leadframes 100, 600 described above in connection with FIGS. 1-10, examples disclosed herein enable wettable flanks with leads having exposed cross-sections where a majority of the exposed cross-sections correspond to a solderable metal that provides adequate wettability. In some examples, the solderable metal may correspond to 60% or as much as 70% of the exposed cross-section of each of the leads. This increased proportion of exposed solderable metal (70% versus less than half) results in an increase in wettability and, thus, improved solder fillets. As disclosed below, this increased wettability is achieved by implementing a pre-molding process on the leadframes using additive manufacturing techniques.

Figure 11:
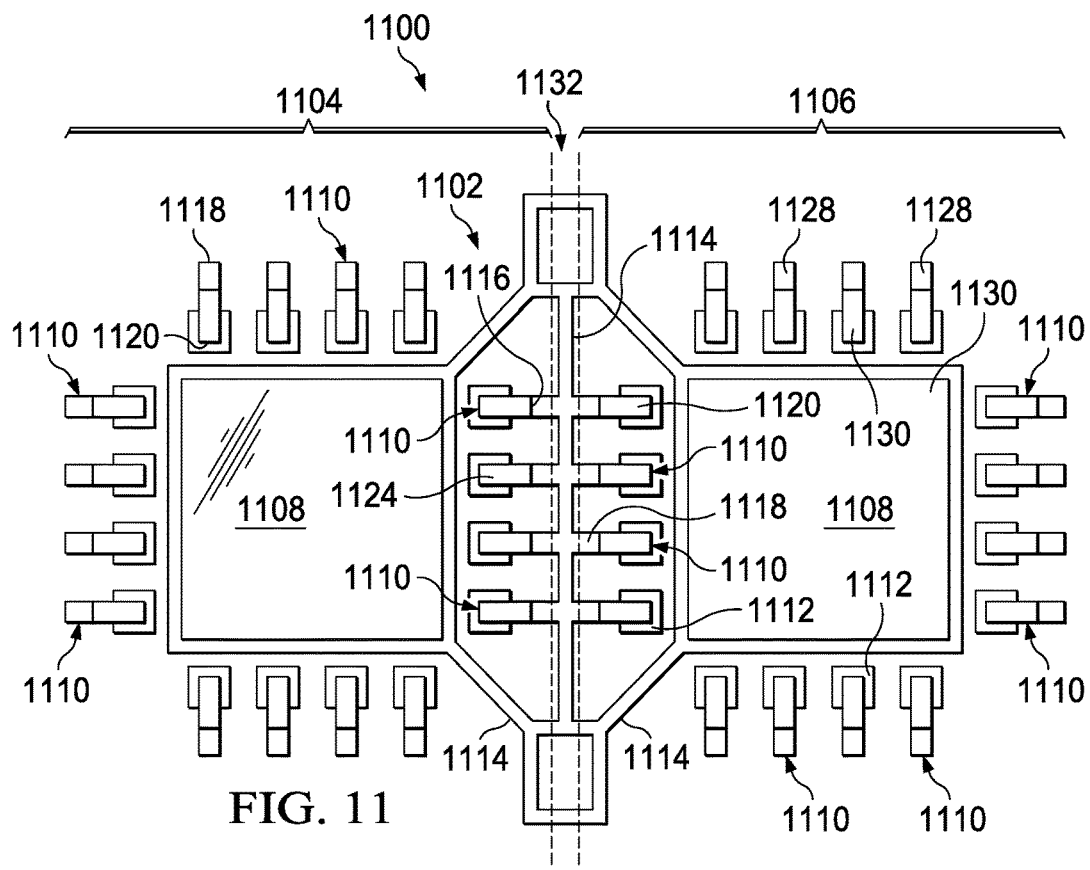
FIG. 11 is a plan view of the mounting side of an example leadframe strip manufactured in accordance with the teachings disclosed herein.
Figure 12:
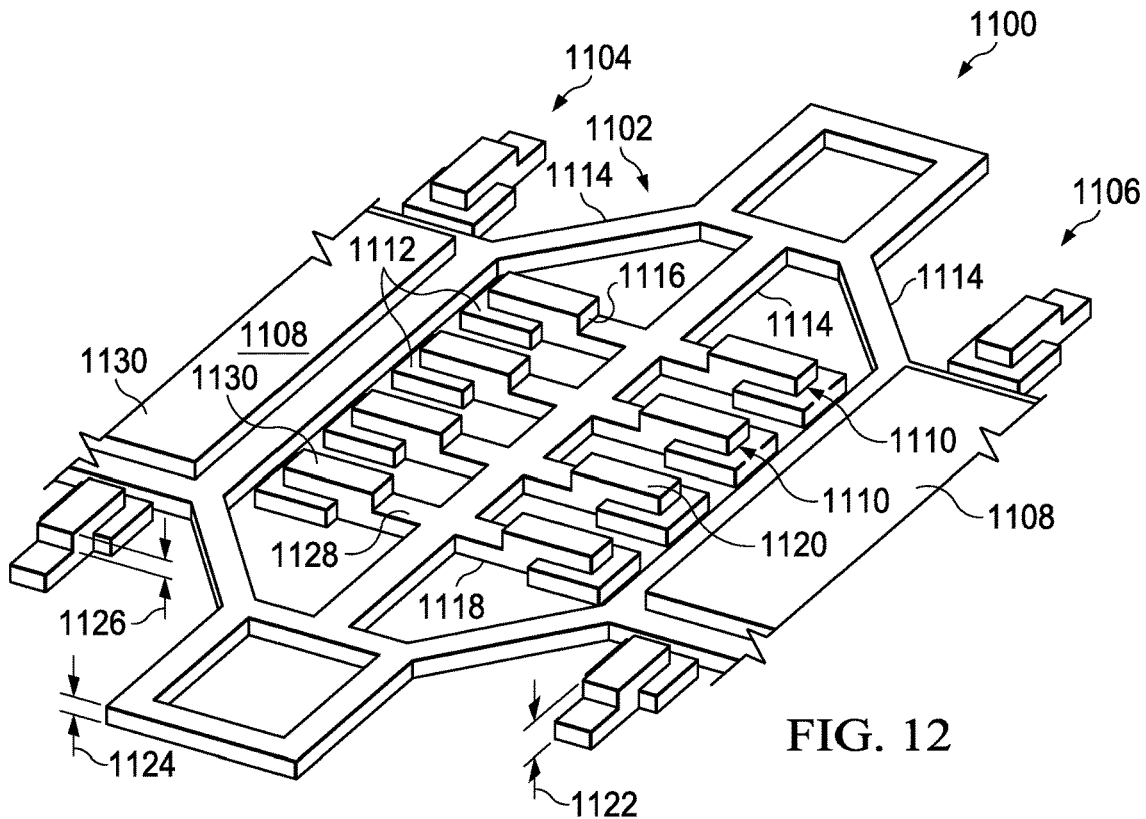
FIG. 12 is an angled detail view of a central region of the mounting side of the leadframe strip of FIG. 11.

In particular, FIG. 11 illustrates the mounting side of an example leadframe strip 1100 manufactured in accordance with teachings of this disclosure. FIG. 12 is an angled detail view of a central region 1102 of the mounting side of the leadframe strip 1100 of FIG. 11. In the illustrated examples, the leadframe strip 1100 includes first and second leadframes 1104, 1106. Each of the leadframes of FIG. 11 has a corresponding die pad 1108 surrounded by a series of leads 1110 (with wire bonding lands 1112) that are spaced apart from one another and the die pads 1108 in a similar arrangement to the example leadframes 104, 106, 604, 606 of FIGS. 1, 2, 5 and 6 as described above. Ribs 1114 interconnect the separate die pads 1108 and leads 1110.

The leads 1110 of the leadframes 1104, 1106 of FIGS. 11 and 12 differ from the corresponding leads of the leadframes 104, 106, 604, 606 of FIGS. 1, 2, 5 and 6. For instance, the example leads 1110 shown in FIGS. 11 and 12 are structured with a stepped profile defined by a lateral facing surface 1116 between a distal end 1118 of the leads 1110 (e.g., the end farthest from the associated die pad 1108) and a proximal end 1120 of the leads 1110 (e.g., the end nearest the associated die pad 108). As shown in the illustrated example, the lateral facing surface 1116 faces toward the distal end 1118 of the leads 1110 and extends between an inner surface 1128 of the leadframes 1104, 1106 (associated with the distal end 1118 of the leads 1110) and an outer surface 1130 of the leadframes 1104, 1106 (associated with the proximal end 1120 of the leads 1110). In the illustrated example, the lateral facing surface 1116 is a planar surface that is substantially perpendicular to the inner and outer surfaces 1128, 1130. However, the lateral facing surface 1116 may be of any suitable shape (e.g., convex, concave, etc.) and need not be perpendicular to the inner and outer surfaces 1128, 1130.

Due to the stepped profile of the leads 1110, as shown in FIG. 12, the proximal ends 1120 of the leads 1110 have a first thickness 1122 while the distal ends 1118 of the leads have a second thickness 1124 that is less than the first thickness 1122. In some examples, the second thickness 1124 of the distal ends 1118 corresponds to the thickness of the ribs 1114 while the thickness of the proximal ends 1120 (including the wire bonding lands 1112) corresponds to the full thickness of the leadframes 1104, 1106. The difference between the first thickness 1122 of the proximal ends 1120 and the second thickness 1124 of the distal ends 1118 corresponds to the thickness or depth 1126 of the lateral facing surface 1116. In some examples, the depth 1126 of the lateral facing surface 1116 is approximately equal to the second thickness 1124 of the distal ends 1118 of the leads 1110. That is, the second thickness 1124 of the distal ends 1118 of the leads 1110 is approximately half the first thickness 1122 of the proximal ends 1120 of the leads. In some examples, the second thickness 1124 of the distal ends 1118 of the leads 1110 is less than the depth 1126 of the lateral facing surface 1116. That is, the second thickness 1124 is less than half (e.g., 40%, 30%, 25%, etc.) of the first thickness 1122.

Figure 13:
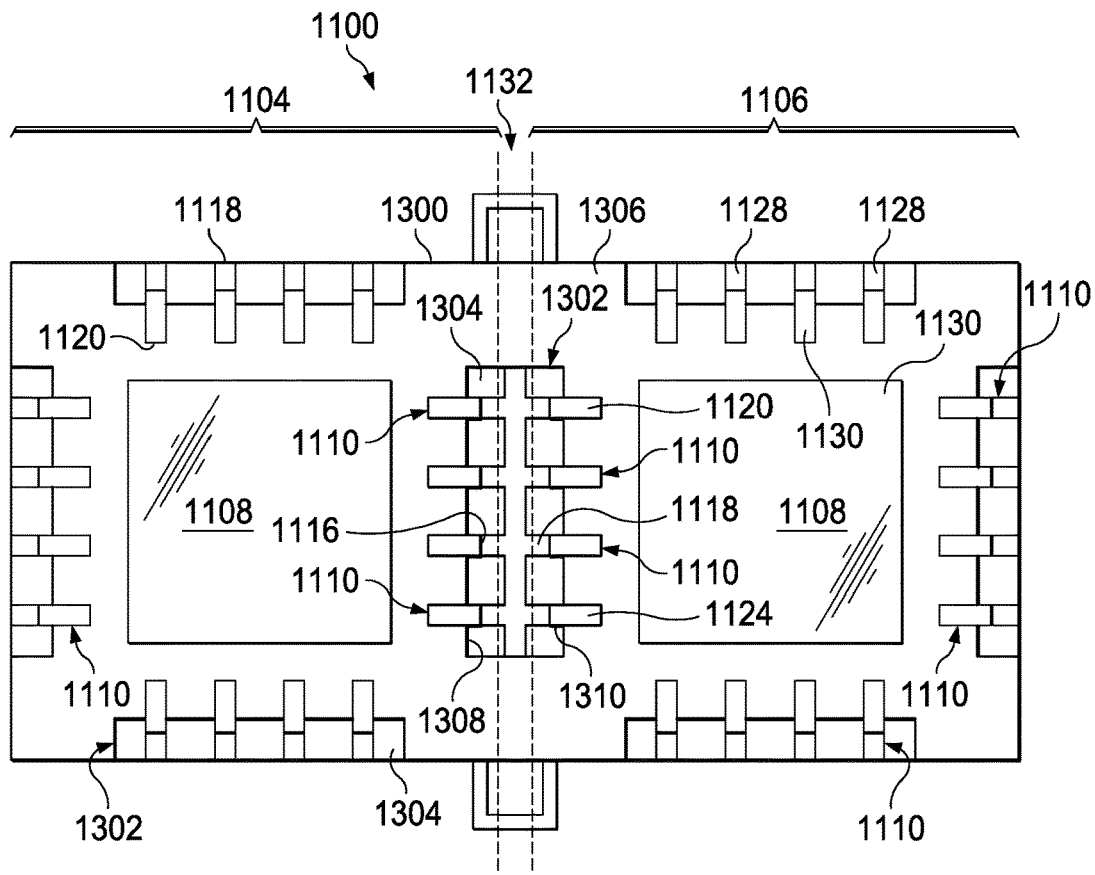
FIG. 13 is a plan view of the example leadframe strip corresponding to FIG. 11 after an example pre-molding process.
Figure 14:
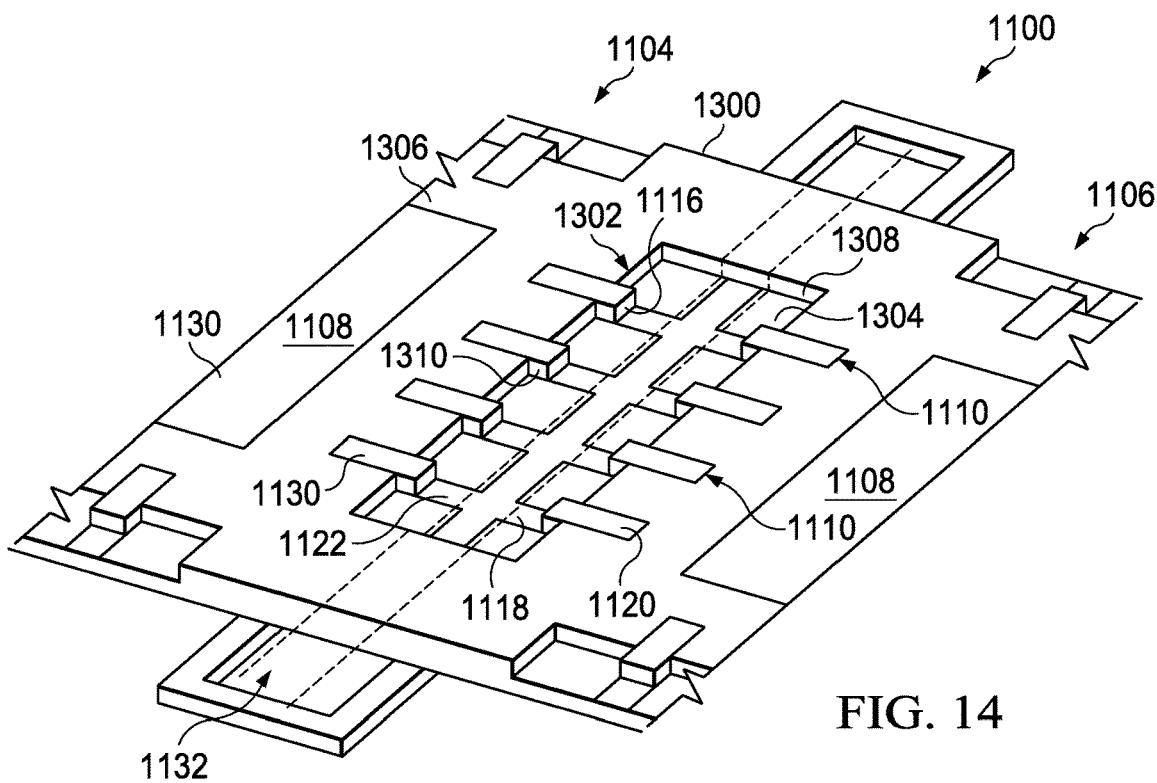
FIG. 14 is an angled detail view of the example leadframe strip corresponding to FIG. 7 after the example pre-molding process.

In some examples, the leadframe strip 1100 is subject to a pre-molding process in which the gaps between the die pads 1108 and the leads 1110 are filled with a molding compound before dies are attached and subsequent processing occurs. However, as disclosed below, the molding compound is selectively applied to control the location of the molding compound and/or to control the thickness or amount of the molding compound applied at such locations. FIGS. 13 and 14 are views of the leadframe strip 1100 which correspond to the views of FIGS. 11 and 12, respectively, except that FIGS. 13 and 14 show the leadframe strip 1100 after the pre-molding process has been completed. This pre-molding process is different than the encapsulation process used to produce the example structures shown in FIGS. 3, 4, 8, and 9 in that the pre-molding process used to produce the example structures shown in FIGS. 13 and 14 occurs before the die attachment and wire bonding processes whereas the encapsulation process occurs after the die attachment and wire bonding processes. Further, while the encapsulation process discussed above in connection with FIGS. 3, 4, 8, and 9 applies an encapsulant to cover the dies and the entire die attach side of a leadframe, pre-molding process(es) disclosed herein leave the outer surface of the die attach side of a leadframe uncovered (so that it is still accessible to subsequently attach a die). Additional detail regarding example pre-molding processes disclosed herein is provided below in connection with FIGS. 18-23.

As shown in FIGS. 13 and 14, a molding compound 1300 has been applied to fill the gaps between the die pads 1108 and the leads 1110. However, the molding compound 1300 is not the same thickness at every location. Rather, as shown in the illustrated example, the molding compound 1300 is formed with cavities or trenches 1302 adjacent the distal ends 1118 of the leads 1110 with a recessed surface 1304 that is at a lower height than a top surface 1306 of the molding compound 1300. The different thicknesses and/or heights at the different regions are achieved by depositing a greater number of layers of the molding compound 1300 at the regions with the greater height (e.g., where the molding compound reaches the top surface 1306) than at the regions with the lower height (e.g., corresponding to the trenches 1302. In some examples, this is accomplished by applying the molding compound using an additive manufacturing device (e.g., an ink jet or other printer configured to print the molding compound). The molding compound deposited by the additive manufacturing process leaves/is in the form of an ink residue. In other words, the ink residue includes the molding compound. In some examples, the height of the top surface 1306 of the molding compound 1300 approximately corresponds to the height of the outer surface 1130 of the mounting side of the leadframes 1104, 1106. The height of the recessed surface 1304 at the bottom of the trenches 1302 may be less than or equal to the height corresponding to the height of the inner surface 1128 of the distal end 1118 of the leads 1110. As a result, as shown in the illustrated examples, the inner surface 1128 at the distal ends 1118 of the leads 1110 remains exposed to the external environment.

In some examples, the additive manufacturing device repeatedly prints or deposits thin layers of the molding compound 1300. In the illustrated example, the pattern for different layers of the molding compound 1300 printed by the additive manufacturing device may differ from one another such that certain regions build up higher than others as different numbers of layers stack in different areas. For instance, in the illustrated example of FIGS. 13 and 14, the initial layer(s) of the molding compound 1300 correspond to patterns that result in the molding compound 1300 being applied everywhere between the portions of the leadframe strip 1100 that do not extend to the outer surface 1130 (e.g., everywhere except on the main body of the die pads 1108 and on the full thickness portion of the proximal end 1120 of the leads 1110). Thus, for these initial layers, the molding compound 1300 is applied in the space immediately adjacent to and in between adjacent ones of the distal ends 1118 of the leads 1110. However, in the illustrated example, once layers of the molding compound 1300 have been added up to the height of the recessed surface 1304 of the trenches 1302, subsequent layers of the molding compound 1300 do not cover the area corresponding to the trenches 1302.

As described above, by forming the trenches 1302 layer by layer in this additive manner, the inner surface 1128 of the distal ends 1118 of the leads 1110 remain exposed to the external environment. Additionally, as shown in the illustrated examples, sidewalls 1308 of the trenches 1302 are dimensioned so that the lateral facing surfaces 1116 on the leads 1110 are also exposed to the external environment. That is, the lateral facing surfaces 1116 of the leads 1110 remain uncovered and opened to the opening or cavity defined by the trenches 1302. In some examples, the sidewalls 1308 of the trenches 1302 are positioned approximately flush or even with the lateral facing surfaces 1116 of the leads 1110. In other examples, as shown in FIGS. 13 and 14, the lateral facing surfaces 1116 protrude into the trenches 1302. As a result, a portion of the sides 1310 of the leads 1110 may also remain exposed to the external environment.

Once the pre-molding process is complete (as represented in FIGS. 13 and 14), subsequent packaging processes may proceed using any suitable technique. That is, dies may be attached and electrically connected to respective leadframes 1104, 1106 and then the assembled components may undergo an encapsulation process. In the illustrated example of FIGS. 13 and 14, there are no longer any gaps or spaces between the different die pads 1108 and leads 1110 because of the molding compound 1300 applied during the pre-molding process. As a result, during the final encapsulation process, there is no way for encapsulant to flow into the trenches 1302 such that the exposed portions of the leads 1110 (e.g., the inner surface 1128 of the distal ends 1118 of the leads and the lateral facing surface 1116) remain exposed.

Figure 15:
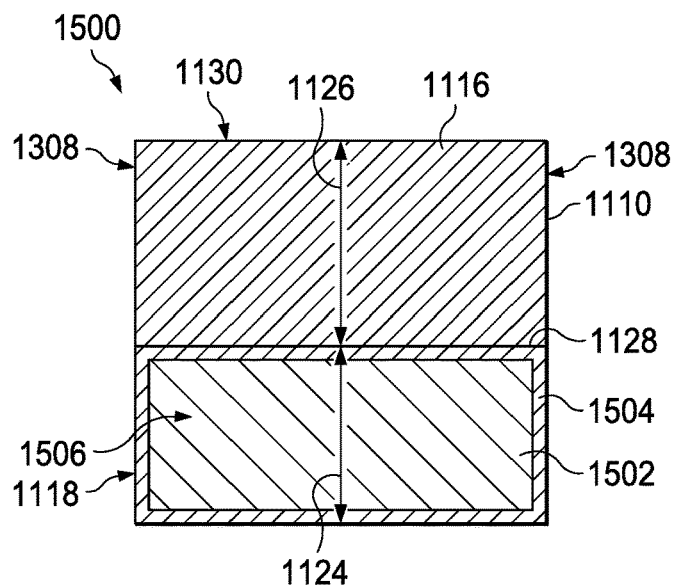
FIG. 15 illustrates an exposed cross-section of one of the example leads on the example leadframe strip of FIGS. 11-14 after singulation.

After the encapsulation process, the leadframes 1104, 1106 (and the encapsulated dies mounted thereon) are separated during a singulation process along a singulation path 1132 represented in FIGS. 11, 13, and 14 by dashed lines. As discussed above, as a singulation saw travels along the path 1132, the saw will cut through the leads 1110 thereby exposing a cross-section 1500 of the leads 1110. Such an example cross-section is represented in FIG. 15. In the example illustrated in FIG. 15, the outer surface 1130 corresponding to the mounting side of the associated leadframe is represented at the top of the drawing. In the illustrated example, the lead 1110 is made of copper 1502 with a solderable metal 1504 coating its exterior surface. Due to the stepped profile of the lead 1110, when a singulation saw passes through the lead 1110, a relatively small cut surface 1506 of the copper 1502 is exposed while the remaining area of the cross-section 1500 (corresponding to the area of the lateral facing surface 1116) remains plated with the solderable metal 1504. That is, as shown in the illustrated example, the amount of copper 1502 exposed in the cross-section 1500 is limited to the second thickness 1124 of the distal end 1118 of leads 1110 that was cut during singulation. By contrast, the majority of the exposed cross-section 1500 corresponds to the thickness or depth 1126 of the lateral facing surface 1116, which remains covered by the solderable metal 1504. In other words, the area of the cut surface 1506 is less than half the full cross-sectional area of the cross-section 1500 of FIG. 15. The exposure of the solderable metal 1504 on the lateral facing surface 1116 (as well as on the inner surface 1128 of the lead 1110 extending (into the drawing of FIG. 15) between the lateral facing surface 1116 and the exposed copper 1502) provides a wettable flank that facilitates the formation of solder fillets when the corresponding IC package is soldered to a PCB. Furthermore, in some examples, where the lateral facing surface 1116 protrudes into the trench 1302 (as shown in FIGS. 13 and 14), additional solderable metal 1504 on the sides 1310 may also be exposed to the external environment. The significantly increased proportion of exposed solderable metal 1504 (when compared, for example, with the dimple 616 of FIG. 10) provides for greater wettability and, thus, better solder joints that can more easily be inspected.

Figure 16:
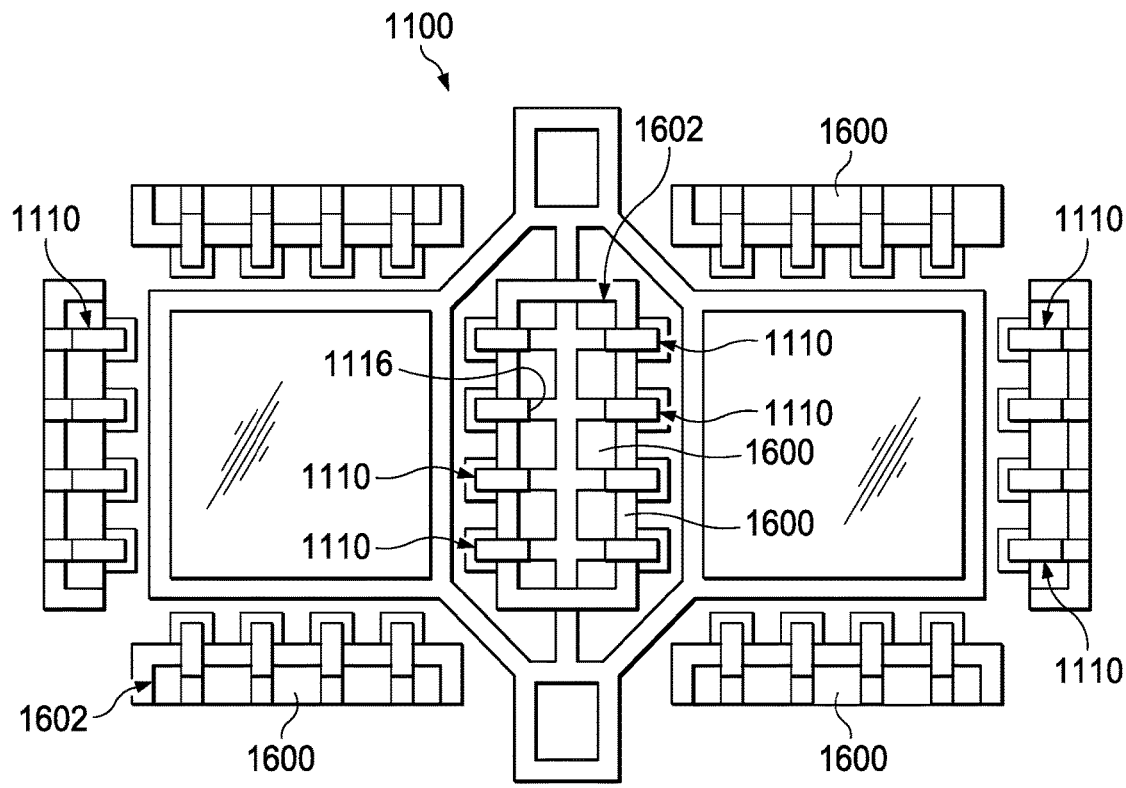
FIG. 16 is a plan view of the example leadframe strip corresponding to FIG. 11 after an example pre-molding process has been completed.
Figure 17:
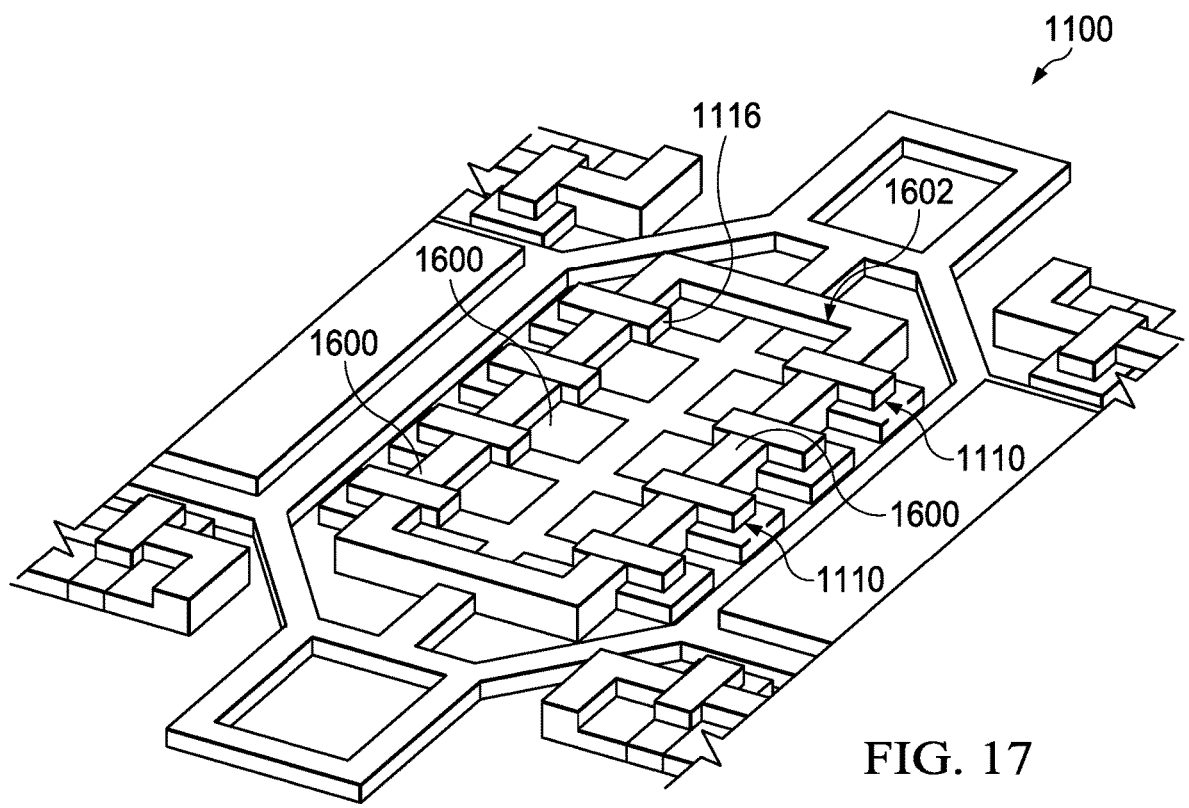
FIG. 17 is an angled detail view of the example leadframe strip corresponding to FIG. 12 after the example pre-molding process has been completed.

FIGS. 16 and 17 illustrate the result of another example pre-molding process that achieves the same exposed cross-section 1500 for the leads 1110 shown in FIG. 15. FIGS. 16 and 17 correspond to FIGS. 13 and 14, respectively, except that the layout of the molding compound 1600 is different. In particular, unlike the molding compound 1300 shown in FIGS. 13 and 14, the molding compound 1600 of FIGS. 16 and 17 is isolated to areas adjacent to the leads 1110. More particularly, in the illustrated examples, the molding compound 1600 is in contact with the leads 1110 but spaced apart from the die pads 1108. Thus, even after the pre-molding process represented by FIGS. 16 and 17, there are still unfilled gaps between the die pads 1108 and the leads 1110. In such examples, these remaining gaps will be filled during the encapsulation process after dies are attached to the leadframes 1104, 1106. However, as described above with FIGS. 13 and 14, the shape of the molding compound 1600 of FIGS. 16 and 17 defines trenches 1602 that expose the lateral facing surfaces 1116 and the outer surface of the distal ends 1118 of the leads 1110 to an external environment and prevent the encapsulant applied during the encapsulation process from covering such exposed surfaces. Therefore, the same result is obtained with the pre-molded leadframe strip 1100 of FIGS. 16 and 17 as is shown in FIGS. 13 and 14 and described above. The layout of the molding compound 1600 in FIGS. 16 and 17 may be advantageous in some situations over the layout of the molding compound 1300 of FIGS. 13 and 14 because the molding compound 1600 of FIGS. 16 and 17 can be deposited (e.g., printed) by an additive manufacturing device more quickly since less material is deposited, thereby reducing the amount of materials used and the time needed to complete the pre-molding process. In other examples, the molding compound 1300 of FIGS. 13 and 14 may be beneficial, where, for example, the molding compound 1300 filling all gaps is relied on to provide additional stability to the leadframe strip 1100 during subsequent processing.

FIGS. 18-23 illustrate example stages in the process of manufacturing IC packages in accordance with teachings of this disclosure. FIG. 18 is a cross-sectional view of a portion of an example leadframe strip 1800 centered on a single leadframe 1802. As shown in the illustrated example, the leadframe 1802 includes a die pad 1804 spaced apart from individual leads 1806. In the illustrated example, the top outer surface 1808 corresponds to the die attach side of the leadframe 1802 while the bottom outer surface 1810 corresponds to the mounting side of the leadframe 1802. The leads 1806 in FIG. 18 include a wire bonding land 1812 at a proximal end 1814 of the leads 1806 (e.g., the end closest to the die pad 1804). A distal end 1816 of the leads (e.g., the end farthest from the die pad 1804) are connected to the leads associated with the adjacent leadframes via ribs 1818 (represented with a greater thickness than the distal ends 1816 of the leads 1806 for the sake of clarity).

As shown in FIG. 18, the leads 1806 have a stepped profile defined by a lateral facing surface 1820 extending between the bottom (mounting side) outer surface 1810 of the leadframe 1802 and an inner surface 1822 associated with the distal end of the leads 1806. In this example, the leadframe strip 1800 is made of copper 1824 and has been plated on its exterior surface with a metal plating 1826 that increases the wettability of the exterior surface for soldering. As described above, the metal plating 1826 may include nickel, palladium, tin, and gold.

Figure 20:
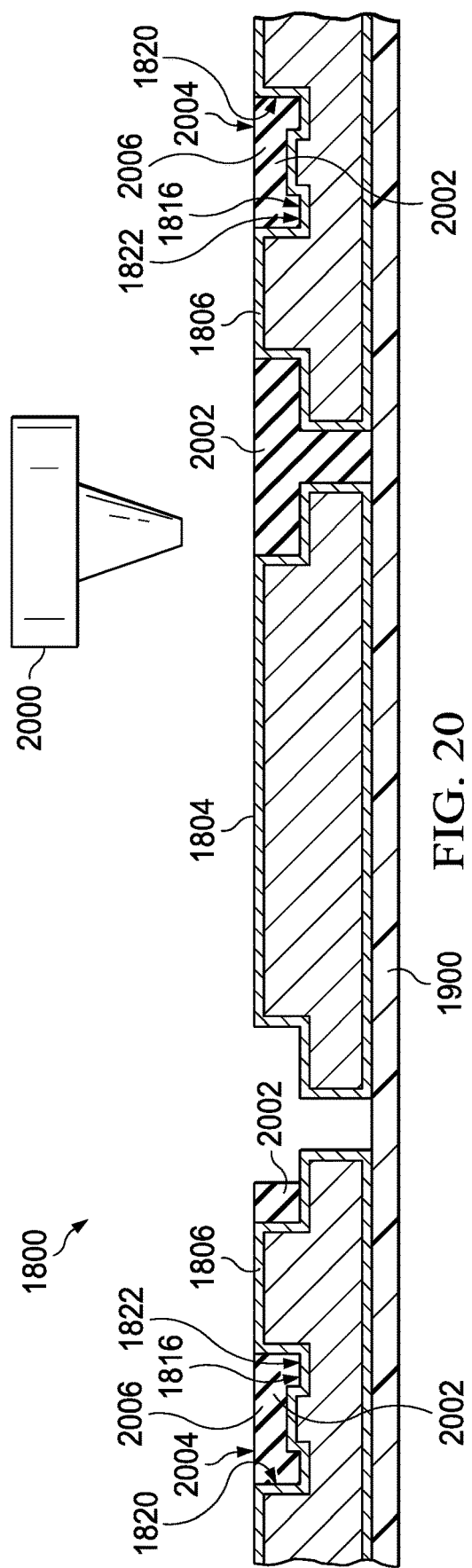

FIG. 19 represents laminate tape 1900 being applied to the die attach side of the leadframe strip 1800 (e.g., the top outer surface 1808 of FIG. 18). As illustrated in FIG. 20, the example leadframe strip 1800 with the laminate tape 1900 of FIG. 19 is flipped over so that the laminate tape 1900 is underneath the leadframe strip 1800. In FIG. 20, an additive manufacturing device 2000 deposits a molding compound 2002 into the gaps between the die pad 1804 and the leads 1806. In some examples, the additive manufacturing device 2000 is an ink jet printer that applies the molding compound 2002 via one or more nozzles of a printhead. In some examples, the additive manufacturing device 2000 completely fills the gaps between the die pad 1804 and the leads 1806 (as represented on the right-hand-side of the die pad 1804 shown in FIG. 20). This is comparable to the pre-molded process represented in FIGS. 13 and 14 above. In some examples, the additive manufacturing device 2000 partially or selectively fills the gaps between the die pad 1804 and the leads 1806 (as represented on the left-hand-side of the die pad 1804 shown in FIG. 20). Whether the gaps are partially or completely filled, the additive manufacturing device 2000 does not apply the molding compound 2002 onto the inner surface 1822 of the distal end 1816 of the leads 1806 or against the lateral facing surface 1820. Rather, as described above, the additive manufacturing device 2000 applies the molding compound 2002 in an area around and adjacent to the distal ends 1816 of the leads 1806 to form a cavity or trench 2004 defined by sidewalls 2006 that extend above the inner surface 1822 to enclose the distal ends 1816 of the leads 1806 while leaving the lateral facing surface 1820 and the inner surface 1822 exposed to an exterior environment.

Figure 21:
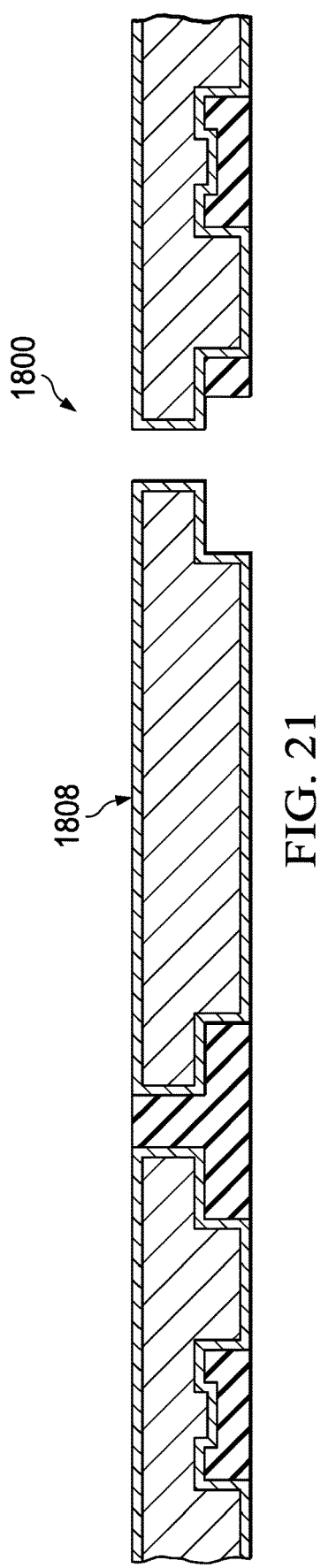
Figure 22:
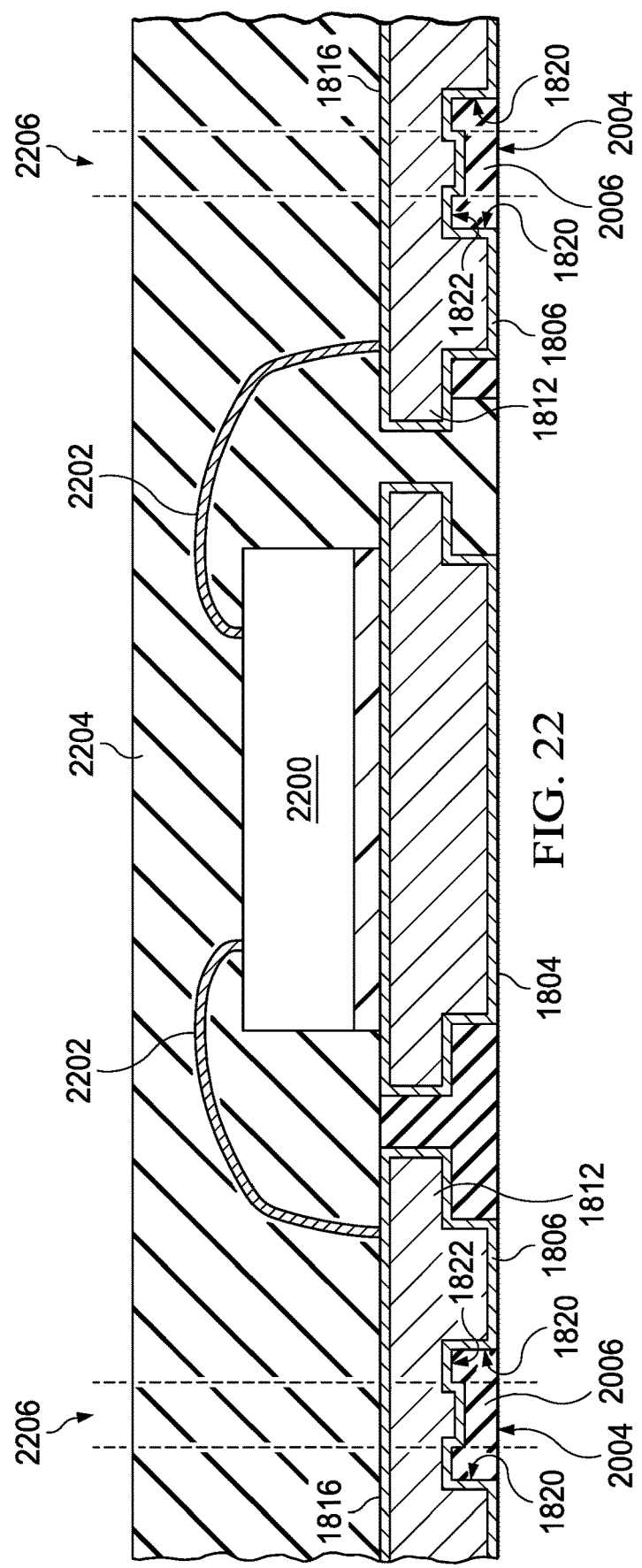

FIG. 21 represents the leadframe strip 1800 after the pre-molding process (represented at FIG. 20) and after the laminate tape 1900 has been removed and the leadframe strip 1800 flipped back over so the die attach side (the top outer surface 1808) of the leadframe strip 1800 is facing up for subsequent processing. The subsequent processing includes any suitable techniques to attach a die 2200 to the die pad 1804 and connect wire bonds 2202 between the die 2200 and the wire bonding lands 1812 of the leads 1806 as shown in FIG. 22. FIG. 22 also represents the results of an encapsulation process in which the die 2200 is encapsulated within an encapsulant 2204. In some examples, the molding compound 2002 used in the pre-molding process is the same as the encapsulant 2204 used in the encapsulation process. In other examples, the molding compound 2002 and the encapsulant 2204 are different.

As shown in the illustrated example, the portions of the gaps between the die pad 1804 and the leads 1806 that were not entirely filled by the pre-mold molding compound 2002 (on the right-hand-side of FIG. 22) is filled by the encapsulant 2204 of the encapsulation process. However, as shown in the illustrated example of FIG. 22, the encapsulant 2204 of the encapsulation process is blocked from reaching the exposed lateral facing surface 1820 and the inner surface 1822 of the leads 1806 because of the sidewall 2006 of the trench 2004 surrounding the distal ends 1816 of the leads 1806. Thus, the lateral facing surface 1820 and the inner surface 1822 of the leads 1806 remain exposed to the exterior environment even after the encapsulation process.

Figure 23:
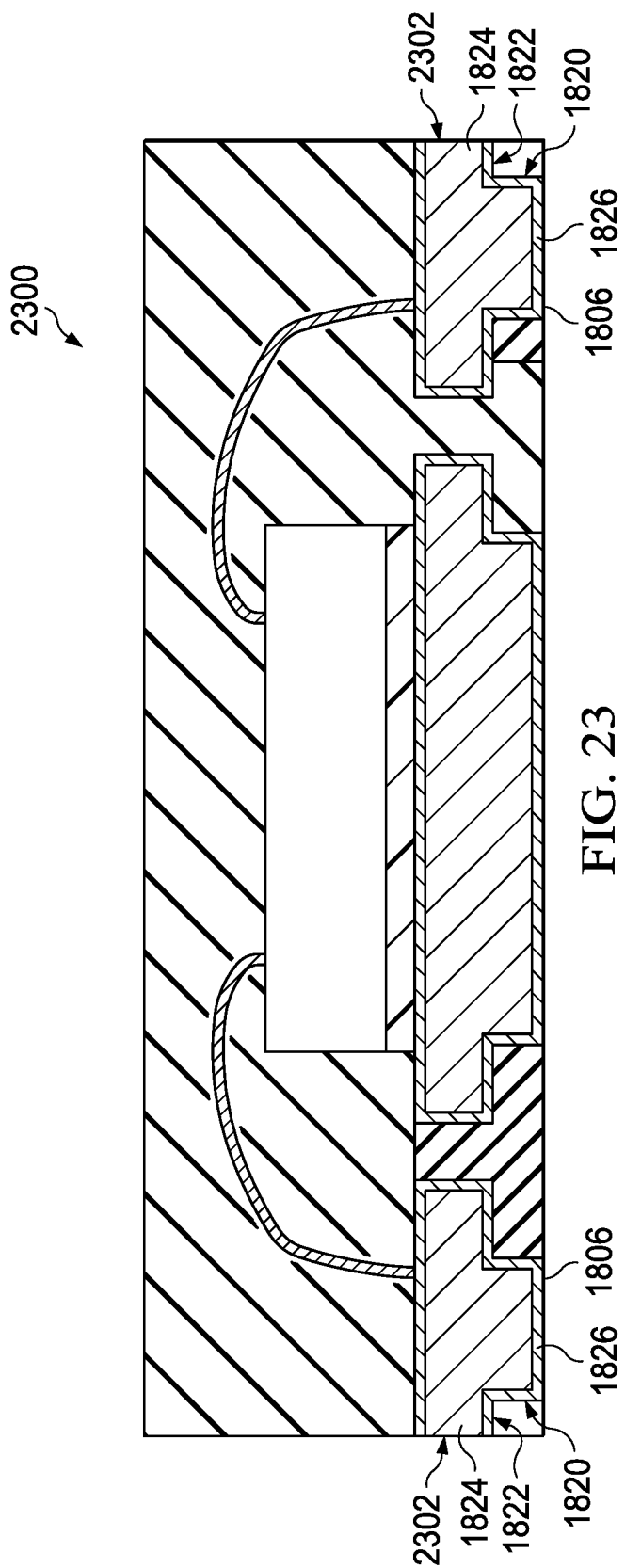

FIG. 23 represents the final IC package 2300 resulting from the process represented by FIGS. 18-22 after the singulation process. In particular, as represented in FIG. 22, singulation paths 2206 define the path of a singulation saw that cuts out the IC package 2300 to its final form. As shown in the illustrated example of FIG. 23, singulation produces a cut surface 2302 of the lead 1806 that exposes some of the copper 1824 of the leadframe to the exterior environment. Copper surfaces do not provide sufficient wettability to form solder fillets that are easily inspected. However, in the illustrated example, the leads 1806 nevertheless form wettable flanks because the metal plating 1826 along the lateral facing surface 1820 and the inner surface 1822 of the mounting side of the leads 1806 remain exposed to the exterior environment.

Figure 24:
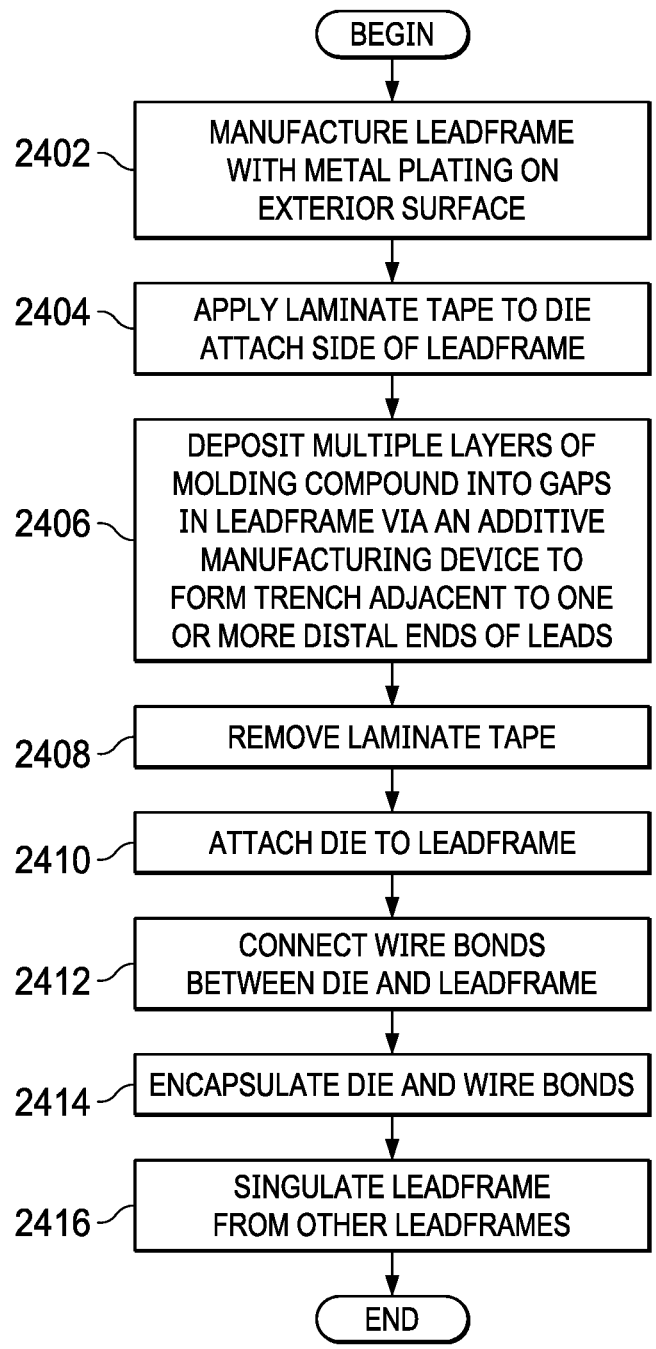
FIG. 24 is a flowchart representative of an example method to manufacture the example IC package of FIG. 23.

FIG. 24 is a flowchart representative of an example method to manufacture the example IC package 2300 of FIG. 23 with wettable flanks. The example process begins at block 2402 by manufacturing a leadframe (e.g., the leadframe 1802) with metal plating on its exterior surface. In some examples, the pre-plated leadframe may be provided by a separate manufacturer and, thus, omitted from the process. At block 2404, a laminate tape (e.g., the laminate tape 1900) is applied to the die attach side of the leadframe 1802. At block 2406, multiple layers of a molding compound (e.g., the molding compound 2002) are deposited into gaps in the leadframe 1802 via an additive manufacturing device to form a trench adjacent to one or more distal ends of leads of the leadframe 1802. At block 2408, the laminate tape 1900 is removed. At block 2410, a die (e.g., the die 2200) is attached to the leadframe 1802. At block 2412, wire bonds (e.g., the wire bonds 2202) bare connected between the die 2200 and the leadframe 1802. At block 2414, the die 2200 and the wire bonds 2202 are encapsulated. At block 2416, the leadframe 1802 is singulated (e.g., cut) from other leadframes.

Although example methods are described with reference to the flowcharts illustrated in FIG. 24, many other methods of manufacturing the example IC package 2300 of FIG. 23 may alternatively be used in accordance with the teachings disclosed herein. For example, the order of execution of the blocks may be changed, and/or some of the blocks described may be changed, eliminated, or combined. Similarly, additional operations may be included in the manufacturing process before, in between, or after the blocks shown in the illustrated example.

From the foregoing, it will be appreciated that example methods, apparatus and articles of manufacture have been disclosed that enable the manufacture of IC packages with improved wettable flanks. In particular, the wettable flanks are associated with leads of a leadframe that have a stepped profile with an exterior surface that has been pre-plated with a solderable metal that facilitates wettability for solder. The stepped profile reduces the proportion of exposed copper on the inside of the leads resulting from singulation while increasing the proportion of the pre-plated metal that is exposed to the external environment. The exposed surfaces of the leads that are coated with the solderable metal are maintained exposed to the external environment by pre-molding the leadframe using an additive manufacturing process that forms a trench within the applied molding compound around the distal ends of the leads. The trench is constructed so that the surfaces remain exposed to the environment while the sidewalls of the trench prevent an encapsulant of any subsequent encapsulation process from reaching the exposed surfaces.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A packaged device comprising:
    a die pad;
    a lead having a proximal end adjacent the die pad and a distal end extending away from the die pad, the lead having a thickness at the distal end that is less than a thickness at the proximal end;
    a die attached to the die pad and electrically connected to the lead;
    a first mold compound having ink residue between the die pad and the lead; and
    a second mold compound contacting portions of the die pad and the lead, wherein a first surface of the first mold compound is coplanar with a first surface of the lead, and wherein a second surface of the first mold compound, opposite to the first surface of the first mold compound, is exposed from the packaged device.

2. The packaged device of claim 1, wherein the first surface of the first mold compound is coplanar with a first surface of the die pad.

3. The packaged device of claim 2, wherein a second surface of the die pad, opposite to the first surface is exposed from the packaged device.

4. The packaged device of claim 1, wherein the thickness at the distal end is 50% of the thickness at the proximal end.

5. The packaged device of claim 1, wherein the first mold compound is printed via a printer.

6. The packaged device of claim 1, wherein the first mold compound is printed via an inkjet printer.

7. An integrated circuit package comprising:
    a die on a die pad;
    a lead spaced apart from the die pad, the lead having a stepped profile from at least one view of the integrated circuit package;
    a first mold compound having ink residue adjacent to portions of the die pad and the lead; and
    a second mold compound contacting portions of the die pad and the lead, wherein the first mold compound includes a trench with a recessed surface adjacent a distal end of the lead and a sidewall adjacent a proximal end of the lead.

8. The integrated circuit package of claim 7, wherein the first mold compound is printed via an inkjet printer.

9. The integrated circuit package of claim 8, wherein a thickness at the distal end that is less than a thickness at the proximal end.

10. A packaged device comprising:
    a die pad;
    a lead having a proximal end adjacent the die pad and a distal end extending away from the die pad, the lead having a thickness at the distal end that is less than a thickness at the proximal end;
    a die attached to the die pad and electrically connected to the lead;
    an ink residue between the die pad and the lead; and
    a first mold compound contacting portions of the die pad and the lead, wherein a first surface of the ink residue is coplanar with a first surface of the lead, and wherein a second surface of the ink residue, opposite to the first surface of the ink residue, is exposed from the packaged device.

11. The packaged device of claim 10, wherein the ink residue includes a second mold compound.

12. The packaged device of claim 10, wherein the ink residue is printed via an inkjet printer.

13. The packaged device of claim 10, wherein the thickness at the distal end is 50% of the thickness at the proximal end.

* * * * *